US006538386B2

(12) United States Patent
Small

(10) Patent No.: US 6,538,386 B2
(45) Date of Patent: Mar. 25, 2003

(54) OPTICAL MAGNETRON FOR HIGH EFFICIENCY PRODUCTION OF OPTICAL RADIATION

(75) Inventor: James G. Small, Tucson, AZ (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/050,744

(22) Filed: Jan. 16, 2002

(65) Prior Publication Data

US 2002/0140356 A1 Oct. 3, 2002

Related U.S. Application Data

(62) Division of application No. 09/584,887, filed on Jun. 1, 2000, now Pat. No. 6,373,194.

(51) Int. Cl.$^{7}$ .......................... H01J 25/50; H01L 21/44

(52) U.S. Cl. .................... 315/39.51; 438/652; 438/669; 438/689

(58) Field of Search .......................... 315/39.51, 39.77, 315/39.53, 39.65, 39.75; 438/652, 669, 689, 708, 734

(56) References Cited

U.S. PATENT DOCUMENTS

| | | | | |
|---|---|---|---|---|
| 3,860,880 A | | 1/1975 | Yariv et al. | 315/39.51 |
| 4,410,833 A | | 10/1983 | Ganguly et al. | 315/3.5 |
| 4,465,953 A | | 8/1984 | Bekefi | 315/39.71 |
| 4,742,272 A | | 5/1988 | Kusano et al. | 315/39.69 |
| 5,280,218 A | | 1/1994 | Smith | 313/59.51 |
| 5,629,225 A | * | 5/1997 | Iwakiri et al. | 438/397 |
| 5,675,210 A | | 10/1997 | Kim | 313/309 |
| 6,005,347 A | | 12/1999 | Lee | 313/103 R |
| 6,064,154 A | | 5/2000 | Crouch et al. | 315/39.57 |

OTHER PUBLICATIONS

Partial International Search Report Re: PCT/US01/16622 mailed on Nov. 13, 2001 with Invitation to Pay Additional Fees.

* cited by examiner

*Primary Examiner*—Don Wong
*Assistant Examiner*—Thuy Vinh Tran
(74) *Attorney, Agent, or Firm*—Renner, Otto, Boisselle & Sklar

(57) ABSTRACT

An optical magnetron is provided which includes a cylindrical cathode having a radius rc, and an annular-shaped anode having a radius ra and coaxially aligned with the cathode to define an anode-cathode space having a width wa=ra−rc. The optical magnetron further includes electrical contacts for applying a dc voltage between the anode and the cathode and establishing an electric field across the anode-cathode space, and at least one magnet arranged to provide a dc magnetic field within the anode-cathode space generally normal to the electric field. A plurality of resonant cavities are provided with each having an opening along a surface of the anode which defines the anode-cathode space. Electrons emitted from the cathode are influenced by the electric and magnetic fields to follow a path through the anode-cathode space and pass in close proximity to the openings of the resonant cavities to create a resonant field in the resonant cavities. The resonant cavities are each designed to resonate at a frequency having a wavelength λ, and circumference 2π ra of the surface of the anode is greater than λ.

5 Claims, 9 Drawing Sheets

OPTICAL MAGNETRON FOR HIGH EFFICIENCY PRODUCTION OF OPTICAL RADIATION

This is a division of application Ser. No. 09/584,887, filed Jun. 1, 2000 which is now U.S. Pat. No. 6,373,194.

TECHNICAL FIELD

The present invention relates generally to light sources, and more particularly to a high efficiency light source in the form of optical magnetron.

BACKGROUND OF THE INVENTION

Magnetrons are well known in the art. Magnetrons have long served as highly efficient sources of microwave energy. For example, magnetrons are commonly employed in microwave ovens to generate sufficient microwave energy for heating and cooking various foods. The use of magnetrons is desirable in that they operate with high efficiency, thus avoiding high costs associated with excess power consumption, heat dissipation, etc.

Microwave magnetrons employ a constant magnetic field to produce a rotating electron space charge. The space charge interacts with a plurality of microwave resonant cavities to generate microwave radiation. Heretofore, magnetrons have been generally limited to maximum operating frequencies below about 100 Gigahertz (Ghz). Higher frequency operation previously has not been considered practical for perhaps a variety of reasons. For example, extremely high magnetic fields would be required in order to scale a magnetron to very small dimensions. In addition, there would be considerable difficulty in fabricating very small microwave resonators. Such problems previously have made higher frequency magnetrons improbable and impractical.

In view of the aforementioned shortcomings associated with conventional microwave magnetrons, there exists a strong need for a magnetron which is suitable as a practical matter for operating at frequencies which exceed 100 Gigahertz (i.e., an optical magnetron). For example, there is a strong need in the art for an optical source capable of producing light with higher efficiency as compared to conventional types of light sources (e.g., incandescent, flourescent, laser, etc.). Such an optical source would have utility in a variety of applications including, but not limited to, optical communications, commercial and industrial lighting, manufacturing, etc.

SUMMARY OF THE INVENTION

The present invention provides an optical magnetron suitable for operating at frequencies heretofore not possible with conventional magnetrons. The optical magnetron of the present invention is capable of producing high efficiency, high power electromagnetic energy at frequencies within the infrared and visible light bands, and which may extend beyond into higher frequency bands such as ultraviolet, x-ray, etc. As a result, the optical magnetron of the present invention may serve as a light source in a variety of applications such as long distance optical communications, commercial and industrial lighting, manufacturing, etc.

The optical magnetron of the present invention is advantageous as it does not require extremely high magnetic fields. Rather, the optical magnetron preferably uses a magnetic field of more reasonable strength, and more preferably a magnetic field obtained from permanent magnets. The magnetic field strength determines the radius of rotation of the electron space charge within the interaction region between the cathode and the anode (also referred to herein as the anode-cathode space). The anode includes a plurality of small resonant cavities which are sized according to the desired operating wavelength. A mechanism is provided for constraining the plurality of resonant cavities to operate in what is known as a pi-mode. Specifically, each resonant cavity is constrained to oscillate pi-radians out of phase with the resonant cavities immediately adjacent thereto. An output coupler or coupler array is provided to couple optical radiation away from the resonant cavities in order to deliver useful output power.

The present invention also provides a number of suitable methods for producing such an optical magnetron. Such methods involve the production of a very large number of resonant cavities along a wall of the anode defining the anode-cathode space. The resonant cavities are formed, for example, using photolithographic and/or micromachining techniques commonly used in the production of various semiconductor devices. A given anode may include tens of thousands, hundreds of thousands, or even millions of resonant cavities based on such techniques. By constraining the resonant cavities to oscillate in a pi-mode, it is possible to develop power levels and efficiencies comparable to conventional magnetrons.

According to one particular aspect of the invention, an optical magnetron is provided. The optical magnetron includes an anode and a cathode separated by an anode-cathode space; electrical contacts for applying a dc voltage between the anode and the cathode and establishing an electric field across the anode-cathode space; at least one magnet arranged to provide a dc magnetic field within the anode-cathode space generally normal to the electric field; and a plurality of resonant cavities each having an opening along a surface of the anode which defines the anode-cathode space, whereby electrons emitted from the cathode are influenced by the electric and magnetic fields to follow a path through the anode-cathode space and pass in close proximity to the openings of the resonant cavities to create a resonant field in the resonant cavities; wherein the resonant cavities are each designed to resonate at a frequency having a wavelength $\lambda$ of approximately 10 microns or less.

According to another aspect of the invention, an optical magnetron is provided which includes a cylindrical cathode having a radius rc; an annular-shaped anode having a radius ra and coaxially aligned with the cathode to define an anode-cathode space having a width wa=ra−rc; electrical contacts for applying a dc voltage between the anode and the cathode and establishing an electric field across the anode-cathode space; at least one magnet arranged to provide a dc magnetic field within the anode-cathode space generally normal to the electric field; and a plurality of resonant cavities each having an opening along a surface of the anode which defines the anode-cathode space, whereby electrons emitted from the cathode are influenced by the electric and magnetic fields to follow a path through the anode-cathode space and pass in close proximity to the openings of the resonant cavities to create a resonant field in the resonant cavities; wherein the resonant cavities are each designed to resonate at a frequency having a wavelength $\lambda$, and a circumference $2\pi$ ra of the surface of the anode is greater than $\lambda$.

In accordance with still another aspect of the invention, an optical magnetron includes an anode and a cathode separated by an anode-cathode space; electrical contacts for applying a dc voltage between the anode and the cathode and establishing an electric field across the anode-cathode space; at least one magnet arranged to provide a dc magnetic field within the anode-cathode space generally normal to the electric field; and a high-density array of N resonant cavities formed along a surface of the anode which defines the anode-cathode space, each of the N resonant cavities having an opening whereby electrons emitted from the cathode are influenced by the electric and magnetic fields to follow a path through the anode-cathode space and pass in close proximity to the openings of the resonant cavities to create a resonant field in the resonant cavities; wherein N is an integer greater than 1000.

In yet another aspect of the invention, a magnetron, includes an anode and a cathode separated by an anode-cathode space; electrical contacts for applying a dc voltage between the anode and the cathode and establishing an electric field across the anode-cathode space; at least one magnet arranged to provide a dc magnetic field within the anode-cathode space generally normal to the electric field; a plurality of resonant cavities each having an opening along a surface of the anode which defines the anode-cathode space, whereby electrons emitted from the cathode are influenced by the electric and magnetic fields to follow a path through the anode-cathode space and pass in close proximity to the openings of the resonant cavities to create a resonant field in the resonant cavities; a common resonator around an outer circumference of the anode to which at least some of the plurality of resonant cavities are coupled to induce pi-mode operation.

According to still another aspect, a magnetron is provided which includes an anode and a cathode separated by an anode-cathode space; electrical contracts for applying a dc voltage between the anode and the cathode and establishing an electric field across the anode-cathode space; a pair of magnets arranged at opposite ends of the anode to provide a dc magnetic field within the anode-cathode space generally normal to the electric field; and a plurality of resonant cavities each having an opening along a surface of the anode which defines the anode-cathode space, whereby electrons emitted from the cathode are influenced by the electric and magnetic fields to follow a path through the anode-cathode space and pass in close proximity to the openings of the resonant cavities to create a resonant field in the resonant cavities; wherein the anode comprises at lease an upper anode and a lower anode, the resonant cavities of the upper anode are each designed to resonate at a frequency having a first wavelength and resonant cavities of the lower anode are each designed to resonate at a frequency having a second wavelength different from the first wavelength.

In yet another aspect, a method of forming an anode for an optical magnetron is provided. The method includes the steps of forming a photoresist layer around an outer surface of a cylindrical core made of a first material; patterning and etching the photoresist layer to form a plurality of vanes which extend radially from the outer surface of the cylindrical core to define a plurality of slots; plating the cylindrical core and vanes with a second material different from the photoresist and the first material; and removing the vanes and cylindrical core from the plating to produce a cylindrical anode having a plurality of slots.

According to still another aspect, a method of forming an anode for an optical magnetron is provided. The method includes the steps of forming a layer of material from which the anode is to be made; patterning and etching the layer to form a first layer of a cylindrical anode with a plurality of resonant cavities formed along an inner circumference of the anode; forming at least one subsequent layer of material and repeating the step of patterning and etching in order to increase the vertical height of the anode.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE PREFERRED EMBODIMENTS

Figure 1:
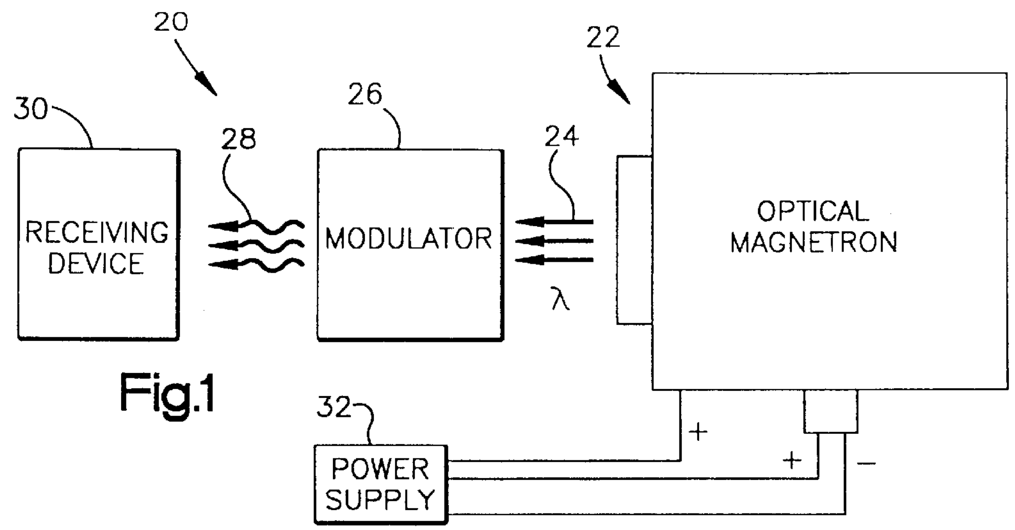
FIG. 1 is an environmental view illustrating the use of an optical magnetron in accordance with the present invention as part of an optical communication system.

The present invention is now described in detail with reference to the drawings. Like reference numerals are used to refer to like elements throughout.

Referring initially to. FIG. 1, an optical communication system 20 is shown. In accordance with the present invention, the optical communication system 20 includes an optical magnetron 22. The optical magnetron 22 serves as a high-efficiency source of output light which may be used to communicate information optically from point-to-point. Although the optical magnetron 22 is described herein in the context of its use in an optical communication system 20, it will be appreciated that the optical magnetron 22 has utility in a variety of other applications. The present invention contemplates any and all such applications.

As is shown in FIG. 1, the optical magnetron 22 serves to output optical radiation 24 such as coherent light in the infrared, ultraviolet or visible light region, for example. The optical radiation is preferably radiation which has a wavelength corresponding to a frequency of 100 Ghz or more. In a more particular embodiment, the optical magnetron 22 outputs optical radiation having a wavelength in the range of about 10 microns to about 0.5 micron. According to an even more particular embodiment, the optical magnetron outputs optical radiation having a wavelength in the range of about 3.5 microns to about 1.5 microns.

The optical radiation 24 produced by the optical magnetron 22 passes through a modulator 26 which serves to modulate the radiation 24 using known techniques. For example, the modulator 26 may be an optical shutter which is computer controlled based on data to be communicated. The radiation 24 is selectively transmitted by the modulator 26 as modulated radiation 28. A receiving device 30 receives and subsequently demodulates the modulated radiation 28 in order to obtain the transmitted data.

The communication system 20 further includes a power supply 32 for providing an operating dc voltage to the optical magnetron 22. As will be explained in more detail below, the optical magnetron 22 operates on a dc voltage provided between the cathode and anode. In an exemplary embodiment, the operating voltage is on the order of 30 kilovolts (kV) to 50 kV. However, it will be appreciated that other operating voltages are also possible.

Figure 2:
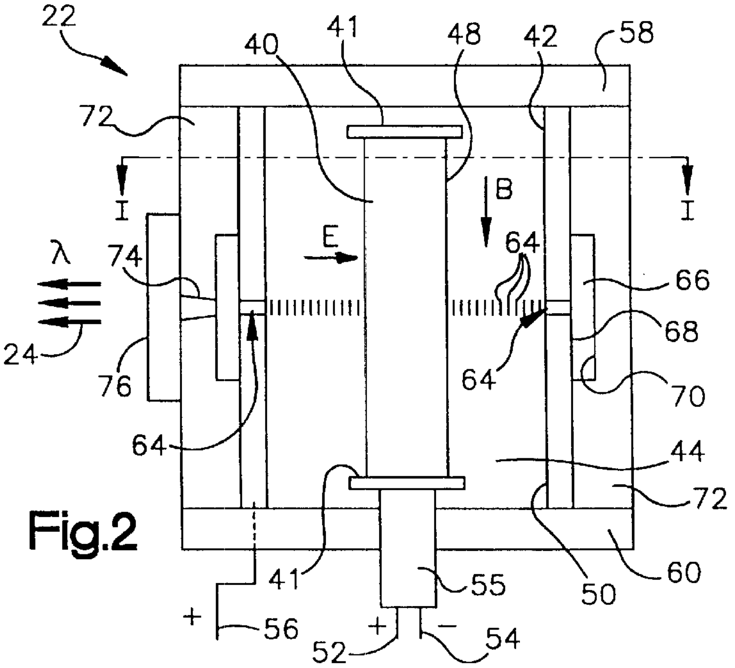
FIG. 2 is a cross-sectional view of an optical magnetron in accordance with one embodiment of the present invention.
Figure 3:
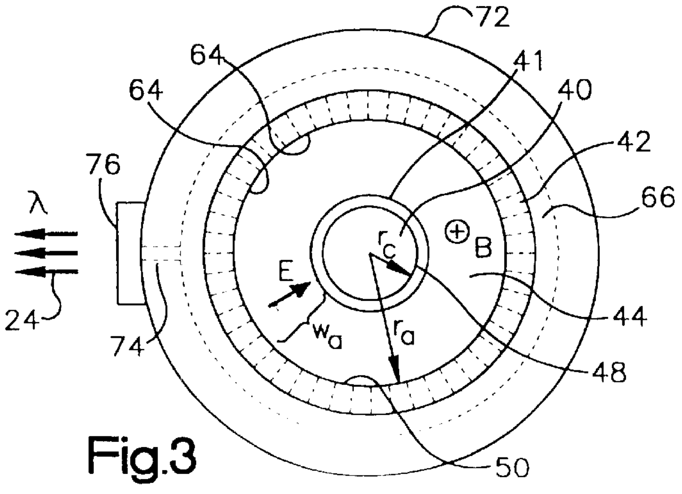
FIG. 3 is a cross-sectional top view of the optical magnetron of FIG. 2 taken along line 1—1.

Referring now to FIGS. 2 and 3, a first embodiment of the optical magnetron 22 is shown. The magnetron 22 includes a cylindrically shaped cathode 40 having a radius rc. Included at the respective ends of the cathode 40 are endcaps 41. The cathode 40 is enclosed within a hollow-cylindrical shaped anode 42 which is aligned coaxially with the cathode 40. The anode 42 has an inner radius ra which is greater than rc so as to define an interaction region or anode-cathode space 44 between an outer surface 48 of the cathode 40 and an inner surface 50 of the anode 42.

Terminals 52 and 54 respectively pass through an insulator 55 and are electrically connected to the cathode 40 to supply power to heat the cathode 40 and also to supply a negative (−) high voltage to the cathode 40. The anode 42 is electrically connected to the positive (+) or ground terminal of the high voltage supply via terminal 56. During operation, the power supply 32 (FIG. 1) applies heater current to and from the cathode 40 via terminals 52 and 54. Simultaneously, the power supply 32 applies a dc voltage to the cathode 40 and anode 42 via terminals 54 and 56. The dc voltage produces a dc electric field E which extends radially between the cathode 40 and anode 42 throughout the anode-cathode space 44.

The optical magnetron 22 further includes a pair of magnets 58 and 60 located at the respective ends of the anode 42. The magnets 58 and 60 are configured to provide a dc magnetic field B in an axial direction which is normal to the electric field E throughout the anode-cathode space 44. As is shown in FIG. 3, the magnetic field B is into the page within the anode-cathode space 44. The magnets 58 and 60 in the exemplary embodiment are permanent magnets which produce a magnetic field B on the order of 2 kilogauss, for example. Other means for producing a magnetic field may be used instead (e.g., an electromagnet) as will be appreciated. However, one or more permanent magnets 58 and 60 are preferred particularly in the case where it is desirable that the optical magnetron 22 provide some degree of portability, for example.

The crossed magnetic field B and electric field E influence electrons emitted from the cathode 40 to move in curved paths through the anode-cathode space 44. With a sufficient dc magnetic field B, the electrons will not arrive at the anode 42, but return instead to the cathode 40.

As will be described in more detail below in connection with FIGS. 4*a*–4*c*, for example, the inner surface 50 of the anode 42 includes a plurality of resonant cavities distributed along the circumference. In a preferred embodiment, the resonant cavities are formed by an even number of equally spaced slots which extend in the axial direction. As the electrons emitted from the cathode 40 follow the aforementioned curved paths through the anode-cathode space 44 and pass in close proximity to the openings of these resonant cavities, a resonant field is created within the resonant cavities. More specifically, the electrons emitted from the cathode 40 tend to form a rotating electron cloud which passes in close proximity to the resonant cavities. The electron cloud excites electromagnetic fields in the resonant cavities causing them to oscillate or "ring". These persistent oscillatory fields in turn accelerate or decelerate passing electrons causing the electron cloud to bunch and form rotating spokes of charge.

Such operation involving a cathode, anode, crossed electric and magnetic fields, and resonant cavities is generally known in connection with conventional magnetrons operating at frequencies below 100 Ghz. As noted above, however, higher frequency operation has not been practical in the past for a variety of reasons. The present invention overcomes such shortcomings by presenting a practical device for operating at frequencies higher than 100 Ghz. Unlike conventional magnetrons, the present invention is not limited to a small number of resonant cavities through which to generate the desired output radiation. Moreover, the present invention is not constrained to a very small device which would require extremely high magnetic fields and power densities within the device.

More particularly, the optical magnetron 22 includes a relatively large number of resonant cavities within the anode 42. These resonant cavities are preferably formed using high precision techniques such as photolithography, micromachining, electron beam lithography, reactive ion etching, etc., as will be described more fully below. The magnetron 22 has a relatively large anode 42 compared to the operating wavelength λ, such that the circumference of the inner anode surface 50, equal to 2 π ra, is substantially larger than the operating wavelength λ. The result is an optical magnetron 22 which is practical both in the sense that it does not require extremely high magnetic fields and it can be the same size as a conventional magnetron used in in the microwave band, for example.

In the exemplary embodiment of FIG. 2, every other resonant cavity includes a coupling port 64 which serves to couple energy from the respective resonant cavities to a common resonant cavity 66. The coupling ports 64 are formed by holes or slots provided through the wall of the anode 42. The resonant cavity 66 is formed around the outer circumference of the anode 42, and is defined by the outer surface 68 of the anode 42 and a cavity defining wall 70 formed within a resonant cavity structure 72. As is shown in FIGS. 2 and 3, the resonant cavity structure 72 forms a cylindrical sleeve which fits around the anode 42. The.resonant cavity. 66 is positioned so as to be aligned with the coupling ports 64 from the respective resonant cavities. The resonant cavity 66 serves to constrain the plurality of resonant cavities to operate in the pi-mode as is discussed more fully below in connection with FIG. 4*c*.

In addition, the cavity structure 72 may serve to provide structural support to the anode 42 which in many instances will be very thin. The cavity structure 72 also facilitates cooling the anode 42 in the event of high temperature operation.

The common resonant cavity 66 includes at least one or more output ports 74 which serve to couple energy from the resonant cavity 66 out through a transparent output window 76 as output optical radiation 24. The output port(s) 72 are formed by holes or slots provided through the wall of the resonant cavity structure 72.

The structure shown in FIGS. 2 and 3, together with the other embodiment described herein, is preferably constructed such that the anode-cathode space 44 and resonant cavity 66 are maintained within a vacuum. This prevents dust or debris from entering into the device and otherwise disturbing the operation thereof.

Figure 4A:
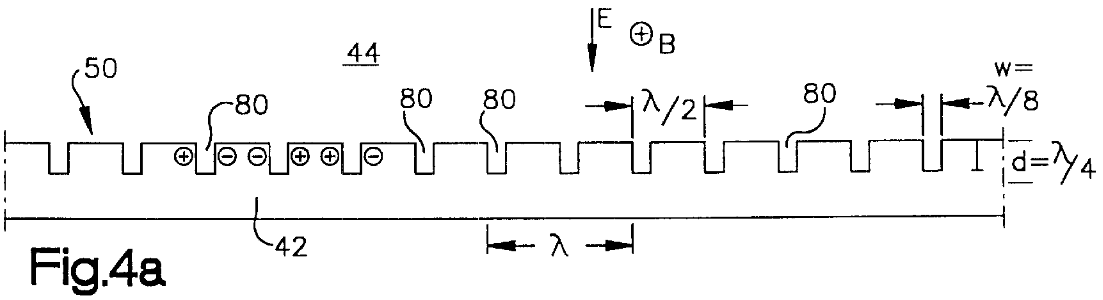
FIGS. 4*a*, 4*b* and 4*c* are enlarged cross-sectional views of a portion of the anode in accordance with the present invention, each anode including resonant cavities according to one embodiment of the present invention.

FIG. 4*a* represents a cross-sectional view of a portion of the anode 42 according to a general embodiment. The cross-section is taken in a plane which is perpendicular to the common axis of the anode 42 and cathode 40 as will be appreciated. The curvature of the anode 42 has not been shown for ease of illustration. As is shown, each resonant cavity within the anode 42 is represented by a slot 80 formed at the surface 50 of the anode 42. In the exemplary embodiment, the slots 80 have a depth d equal to λ/4 to allow for resonance, where A represents the wavelength of the output optical radiation 24 at the desired operating frequency. The slots 80 are spaced apart a distance of λ/2, and each slot has a width w equal to λ/8. The slot width w should be λ/8 or less to allow electrons to pass the slot 80 before the electric field reverses in pi-mode operation as can be shown.

The total number N of slots 80 in the anode 42 is selected such that the electrons moving through the anode-cathode space 44 preferably are moving substantially slower than the speed of light c (e.g., approximately on the order of 0.1 c to 0.3 c). The slots 80 are evenly spaced around the inner circumference of the anode 42, and the total number N is selected so as to be an even number in order to permit pi-mode operation. The slots 80 have a length which may be somewhat arbitrary, but preferably is similar in length to the cathode 40. For ease of description, the N slots 80 may be considered as being numbered in sequence from 1 to N about the circumference of the anode 42.

Figure 4B:
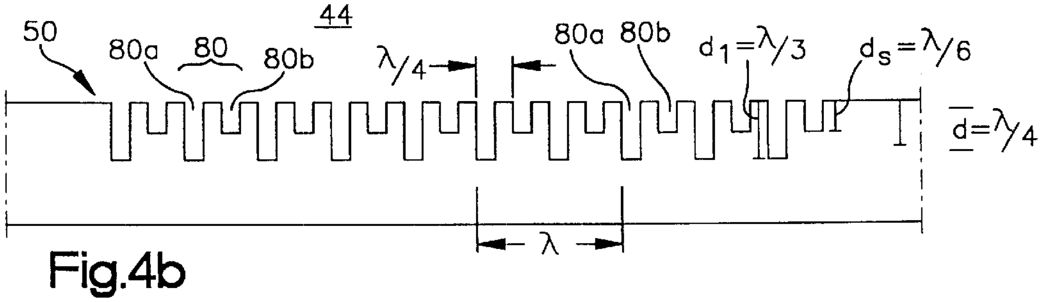

FIG. 4*b* represents a particular embodiment of the anode 42 designed to encourage pi-mode oscillation at the desired operating frequency. The aforementioned slots 80 are actually comprised of long slots 80*a* and short slots 80*b*. The long slots 80*a* and short slots 80*b* are arranged at intervals of λ/4 in alternating fashion as shown in FIG. 4*b*. The long slots 80*a* and short slots 80*b* have a depth ratio of 2:1 and an average depth of λ/4 in the preferred embodiment. Consequently, the long slots 80*a* have a depth dl equal to λ/3 and the short slots 80*b* have a depth ds equal to λ/6. Such arrangement of long and short slots is known in the microwave bands as a "rising sun" configuration. Such configuration promotes pi-mode oscillation with the long slots 80*a* lagging in phase and the short slots 80*b* leading in phase.

Although not shown in FIGS. 4*a* and 4*b*, one or more of the resonant cavities formed by the respective slots 80 will include one or more coupling ports 64 which couple energy from within the slot 80 to the common resonant cavity 66 as represented in FIGS. 2 and 3, for example. Alternatively, the coupling port(s) 64 serve to couple energy from within the respective slots 80 directly out through the output window 76 as discussed below in connection with the embodiment of FIGS. 9 and 10, for example. The coupling ports 64 preferably are provided with respect to slots 80 which are in phase with each other so as to add constructively. Alternatively, one or more phase shifters may be used to adjust the phase of radiation from the coupling ports 64 so as to all be in phase.

Figure 4C:
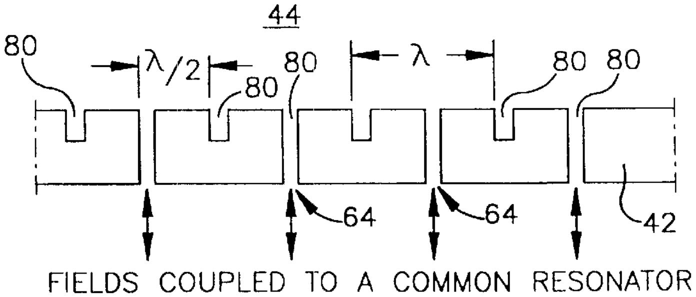

FIG. 4*c* represents another particular embodiment of the anode 42 designed to encourage pi-mode oscillation at the desired operating frequency. Such embodiment of the anode 42 is specifically represented in the embodiment of FIGS. 2 and 3. An external stabilizing resonator in the form of the common resonant cavity 66 serves to encourage pi-mode oscillation in accordance with the invention. Specifically, every other slot 80 (i.e., either every even-numbered slot or every odd-numbered slot) is coupled to the resonant cavity 66 via a respective coupling port 64 so as to all be in phase. The slots 80 are spaced at intervals of λ/2 and otherwise each has a depth d equal to λ/4.

As will be appreciated, the slots 80 in each of the embodiments described herein represent micro resonators. The following table provides exemplary dimensions, etc., for an optical magnetron 22 in accordance with the present invention. In the case of a practical sized device in which the cathode 40 has a radius rc of 2 millimeters (mm) and the anode 42 has an inner radius ra of 7 mm, a length of 1 centimeter (cm), a magnetic field B of 2 kilogauss, an electric field E of 30 kV to 50 kV, the dimensions relating to the slots 80 in the case of the configuration of FIG. 4*c* may be as follows, for example:

TABLE

| Operating Wavelength λ (mm) | Number of Slots N | Slot Width w (microns) | Slot Depth d (microns) |
|---|---|---|---|
| $10^{-2}$ | 87,964 | 1.25 | 2.5 |
| $3.5 \times 10^{-3}$ | 251,324 | 0.4375 | 0.875 |
| $1.5 \times 10^{-3}$ | 586,424 | 0.1875 | 0.375 |
| $0.5 \times 10^{-3}$ | 1,759,274 | 0.0625 | 0.125 |

The output power for such a magnetron 22 will be on the order of 1 kilowatt (kW) continuous, and 1 megawatt (MW) pulsed. In addition, efficiencies will be on the order of 85%. Consequently, the magnetron 22 of the present invention is well suited for any application which utilizes a high efficiency, high power output such as communications, lighting, manufacturing, etc.

The micro resonators or resonant cavities formed by the slots 80 can be manufactured using a variety of different techniques available from the semiconductor manufacturing industry. For example, existing micromachining techniques are suitable for forming slots having a width of 2.5 microns or so. Although specific manufacturing techniques are described below, it will be generally appreciated that an electrically conductive hollow cylinder anode body may be controllably etched via a laser beam to produce slots 80 having the desired width and depth. Alternatively, photolithographic techniques may be used in which the anode 42 is formed by a succession of electrically conductive layers stacked upon one another with teeth representing the slots 80. For higher frequency applications (e.g., $\lambda=0.5\times10^{-4}$ mm), electron beam (e-beam) techniques used in semiconductor processing may be used to form the slots 80 within the anode 42. In its broadest sense, however, the present invention is not limited to any particular method of manufacture.

Figure 5:
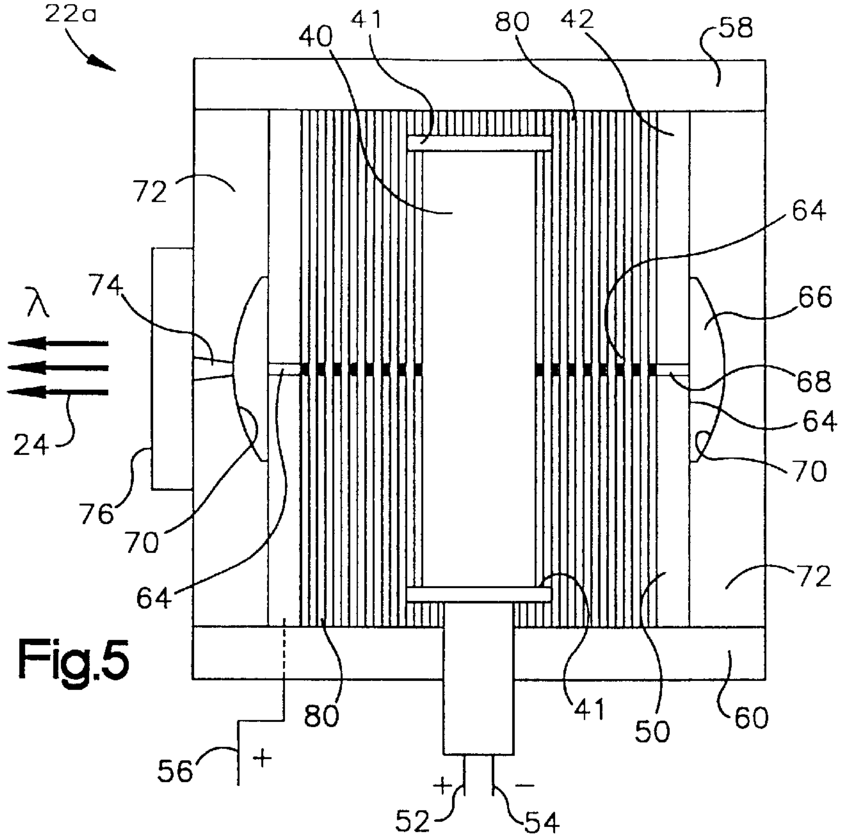
FIG. 5 is a cross-sectional view of an optical magnetron in accordance with another embodiment of the present invention.

Referring now to FIG. 5, another embodiment of the optical magnetron in accordance with the present invention is generally designated 22*a*. Such embodiment is virtually identical to the embodiment of FIGS. 2 and 3 with the following exception. The common resonant cavity 66 in this embodiment has a curved outer wall 70 so as to form a toroidal shaped resonant cavity 66. The radius of curvature of the outer wall 70 is on the order of 2.0 cm to 2.0 m, depending on the operating frequency. The toroidal shaped resonant cavity 66 serves to improve the ability of the common resonant cavity 66 to control the pi-mode oscillations at the desired operating frequency.

It is noted that each of the coupling ports 64 from the even numbered slots 80, for example, are aligned horizontally at the center of the anode 42 with the vertex of the curved outer wall 70. This tends to focus the resonant optical radiation towards the center of the anode 42 and reduce light leakage from the ends of the cylindrical anode 42. The odd numbered slots 80 do not include such coupling ports 64 and consequently are driven to oscillate out of phase with the even numbered slots 80.

Figure 6:
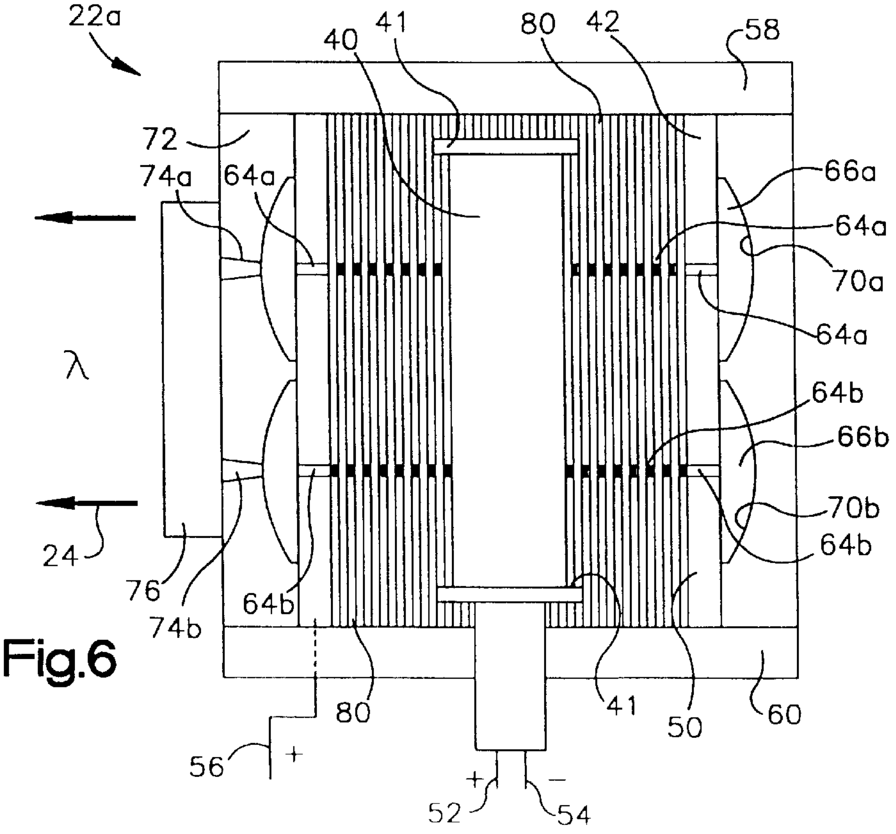
FIG. 6 is a cross-sectional view of an optical magnetron in accordance with yet another embodiment of the present invention.

FIG. 6 illustrates another embodiment of the optical magnetron which is generally designated 22*b*. The embodiment of FIG. 6 is virtually identical to that of FIG. 5 with the following exceptions. In this particular embodiment, the magnetron 22*b* comprises a double toroidal common resonator. More specifically, the magnetron 22*b* includes a first toroidal shaped resonant cavity 66*a* and a second toroidal shaped resonant cavity 66*b* formed in the resonant cavity structure 72. Each of the even-numbered slots 80 among the N total slots 80 is coupled by an coupling port 64*a* to the first cavity 66*a*. Each of the odd-numbered slots 80 among the N total slots 80 is coupled to the second cavity 66*b* by way of an coupling port 64*b*.

The first resonant cavity 66*a* is a higher frequency resonator designed to lock a resonant mode at a frequency which is slightly higher than the desired operating frequency. The second resonant cavity 66*b* is a lower frequency resonator designed to lock a resonant mode at a frequency which is slightly lower than the desired frequency, such that the entire device oscillates at an intermediate average frequency corresponding to the desired operating frequency. The higher frequency modes within the first resonant cavity 66*a* will tend to lead in phase while the low frequency modes in the second resonant cavity 66*b* lag in phase about the desired operation frequency. Consequently, pi-mode operation will result.

Output radiation 24 may be provided from one or both of the output port(s) 74*a* and 74(*b*). Since the outputs from both will be out of phase with respect to each other, it may be desirable to include a phase shifter (not shown) for one of the output port(s) 74*a* and 74*b*.

As in the previous embodiment, the radii of curvature for the outer walls 70*a* and 70*b* of the cavities 66*a* and 66*b*, respectively, are on the order of 2.0 cm to 2.0 m. However, the radius of curvatures are designed slightly shorter and longer for the walls 70*a* and 70*b*, respectively, in order to provide the desired high/low frequency operation with respect to the desired operating frequency.

In a different embodiment, more than two resonant cavities 66 may be formed around the anode 42 for constraining operation to the pi-mode. The present invention is not necessarily limited to a particular number. Furthermore, the cavities 66*a* and 66*b* in the embodiment of FIG. 6 may instead be designed to both operate at the desired operating frequency rather than offset as previously described and as will be appreciated.

Figure 7A:
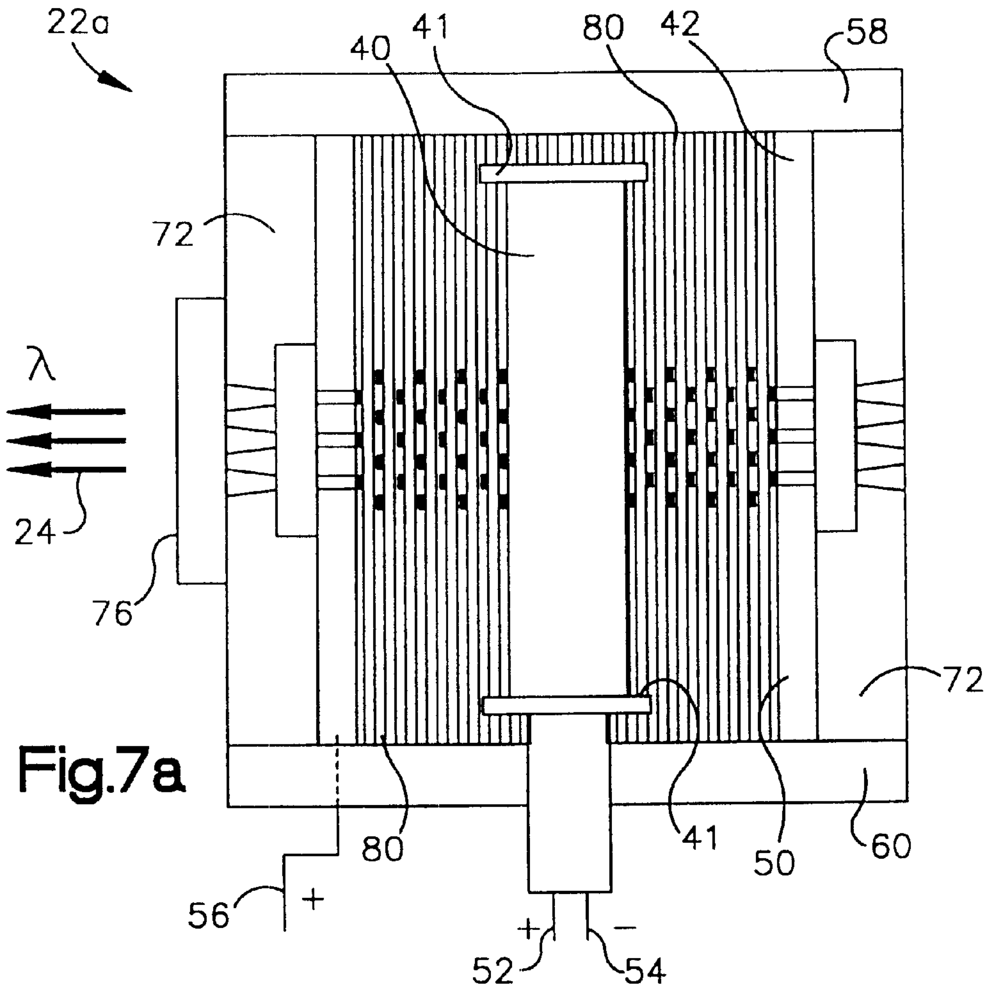
FIG. 7*a* is a cross-sectional view of an optical magnetron in accordance with still another embodiment of the present invention.
Figure 7B:
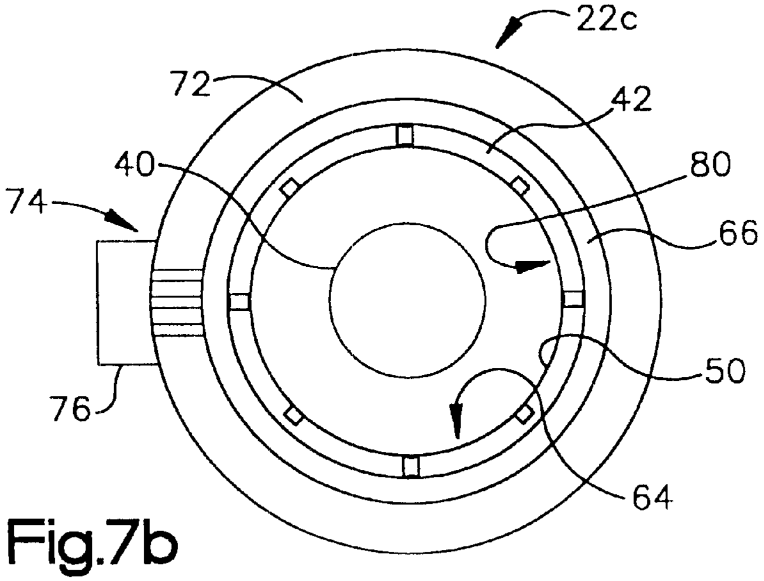
FIG. 7*b* is a cross-sectional top view of the optical magnetron of FIG. 7*a;*

Turning now to FIGS. 7*a* and 7*b*, still another embodiment of an optical magnetron is shown, this time designated as 22*c*. This embodiment illustrates how every other slot 80 (i.e., all the even numbered slots or all the odd numbered slots) may include more than one coupling ports 64 to couple energy from the respective resonant cavity to the common resonant cavity 66. For example, FIG. 7*a* illustrates how even numbered slots 80 formed in the anode 42 alternate having three and four coupling ports 64 in the respective slots 80. As in the other embodiments, the coupling ports 64 couple energy to the common resonant cavity 66 in order to better control the oscillation modes and induce pi-mode operation. As is also shown in FIGS. 7*a* and 7*b*, the optical magnetron 22*c* may include multiple output ports 74*a*, 74*b*, 74*c*, etc., for coupling the output optical radiation 24 from the resonant cavity 66 out through the output window 76. By forming an array of output ports 74 and/or coupling ports 64 as described herein, it is possible to control the amount of coupling which occurs as will be appreciated.

Although not shown in FIG. 7*a*, it will be appreciated that the common resonant cavity 66 could be replaced with a toroidal shaped cavity as in the embodiment of FIG. 5, for example. Moreover, it will be readily appreciated that an optical magnetron 22 in accordance with the invention may be constructed by any combination of the various features and embodiments described herein, namely (i) an anode structure comprising a plurality of small resonant cavities 80 which may be scaled according to the desired operating wavelength to sizes as small as optical wavelengths; (ii) a structure for constraining the resonant cavities 80 to operate in the so-called pi-mode whereby each resonant cavity 80 is constrained to oscillate pi-radians out of phase with its nearest neighbors; and (iii) means for coupling the optical radiation from the resonant cavities to deliver useful output power. Different slot 80 configurations are discussed herein, as are different forms of one or more common resonant cavities for constraining the resonant cavities. In addition, the description herein provides means for coupling power from the resonant cavities via the various forms and arrangements of coupling ports 64 and output ports 74. On the other hand, the present invention is not intended to be limited in its broadest sense to the particular configurations described herein.

Figure 8:
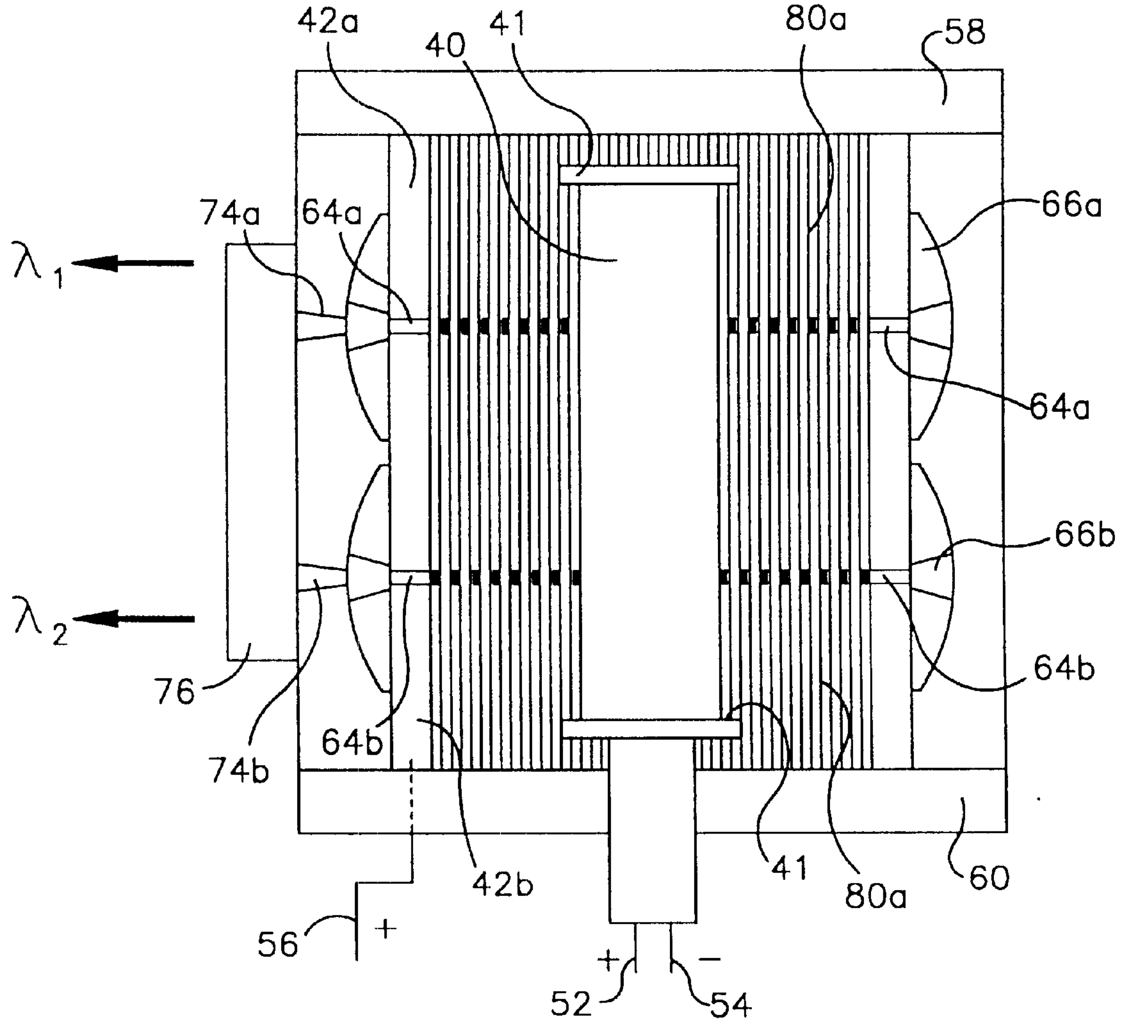
FIG. 8 is a cross-sectional view of an optical magnetron in accordance with a multi-wavelength embodiment of the present invention.

Referring briefly to FIG. 8, a vertically stacked multifrequency embodiment of the present invention is shown. In this embodiment, the anode 42 is divided into an upper anode 42*a* and a lower anode 42*b*. In the upper anode 42*a*, the slots 80*a* are designed with a width, spacing and number corresponding to a first operative wavelength $\lambda_1$. The slots 80*b* in the lower anode 42*b*, on the other hand, are designed with a width, spacing and number corresponding to a second operating wavelength $\lambda_2$ different from the first operating wavelength $\lambda_1$.

Even-numbered slots 80*a*, for example, in the upper anode 42*a* include coupling ports 64*a* which couple energy from a rotating electron cloud formed in the upper anode 42*a* to an upper common resonant cavity 66*a*. Likewise, even-numbered (or odd numbered) slots 80*b* in the lower anode 42*b* include coupling ports 64*b* which couple energy from a rotating electron cloud formed in the lower anode 42*b* to a lower common resonant cavity 66*b*. The upper and lower common resonant cavities 66*a* and 66*b* serve to promote pi-mode oscillation at the respective frequencies $\lambda_1$ and $\lambda_2$ in the upper and lower anodes 42*a* and 42*b*. Energy from the common resonant cavities 66*a* and 66*b* is output through the output window 76 via one or more output ports 74*a* and 74*b*, respectively.

Thus, the present invention as represented in FIG. 8 provides a manner for vertically stacking two or more anode resonators each having a different operating wavelength (e.g., $\lambda_1$ and $\lambda_2$). The anodes (e.g., upper and lower anodes 42*a* and 42*b*) may be stacked vertically between a single pair of magnets 58 and 60. The stacked device may therefore emit multiple frequencies. For example, in a magnetron operating at visible light frequencies, anode resonators oscillating at red, green and blue wavelengths may be stacked vertically in a single device. The light outputs may be utilized separately as part of a color display or combined, for example, to produce a white light source.

Figure 9:
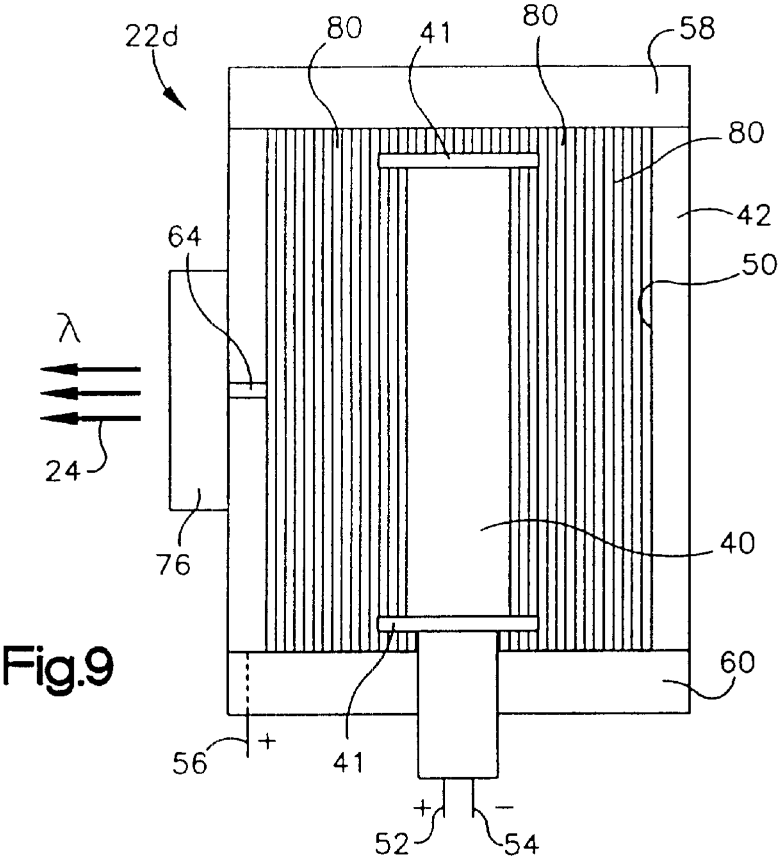
FIG. 9 is a cross-sectional view of an optical magnetron according to another embodiment of the present invention.
Figure 10:
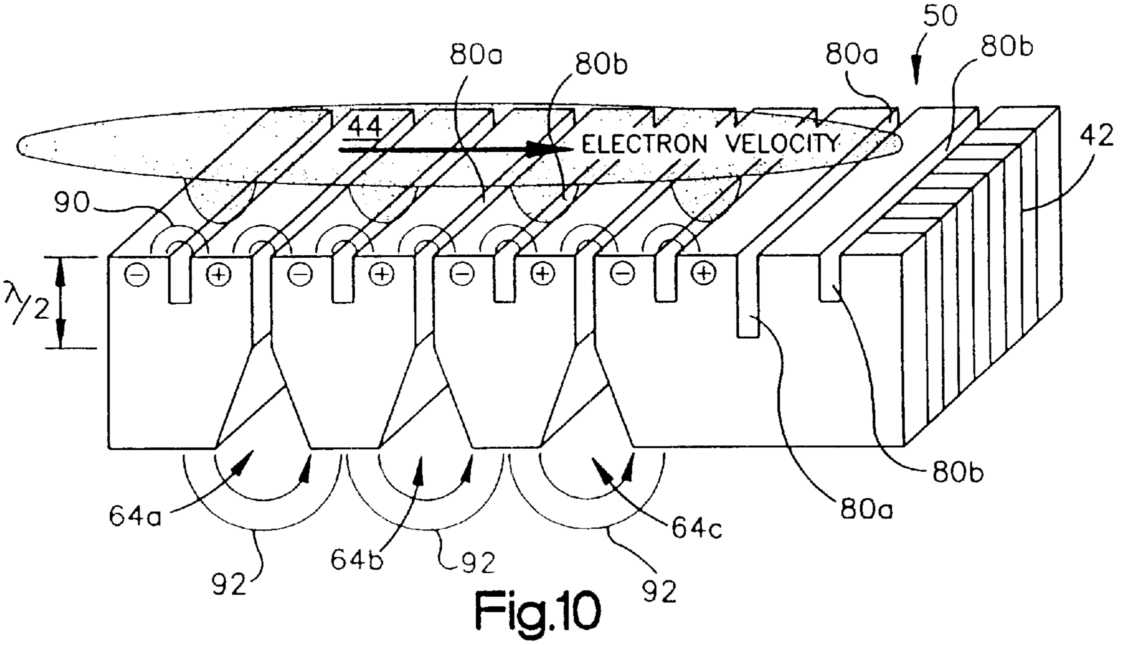
FIG. 10 is an enlarged perspective view of a portion of the anode showing the output coupling.

FIGS. 9 and 10 illustrate an embodiment of the invention which provides direct output coupling via the coupling ports 64 through the output window 76. FIG. 10 illustrates how the rotating electron cloud within the anode-cathode space 44 creates fringing fields 90 at the opening of the slots 80 and the coupling ports 64 therein as the cloud passes by. The fringing fields 90 at the openings of the coupling ports are emitted from the opposite side of the anode 42 as output radiation fields 92.

FIG. 9 illustrates an embodiment in which the output radiation fields 92, as represented in FIG. 10, are output directly through the output window 76. In the other embodiments described herein, the radiation through the coupling ports 64 is first introduced into a common resonant cavity 66 in the same manner represented in FIG. 10. The common resonant cavity 66 provides improved control of the pi-mode operation as previously discussed. Nevertheless, the present invention contemplates an embodiment which is perhaps less efficient but also useful in which the coupling ports 64 provide output radiation directly to the output window 76. In such case, as is shown in FIG. 9, there is no need for coupling ports 64 in the slots 80 other than those which direct output radiation toward the output window 76. The coupling principles of FIG. 10, however, apply to all of the coupling ports 64 and output ports 74 discussed herein as will be appreciated.

Figure 11A:
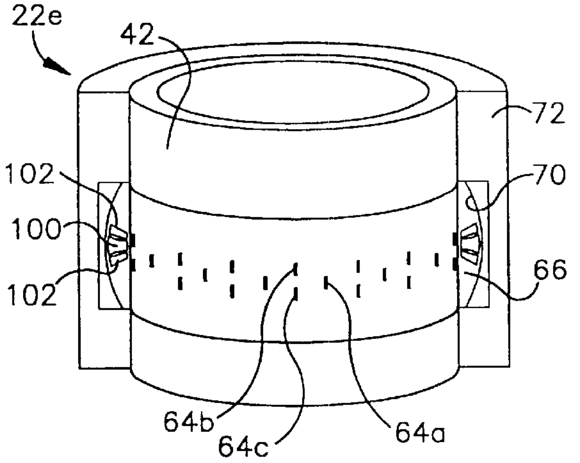
FIGS. 11*a*, 11*b* and 11*c* schematically represent an embodiment of the present invention designed to operate in the $TEM_{20}$ mode.
Figure 11B:
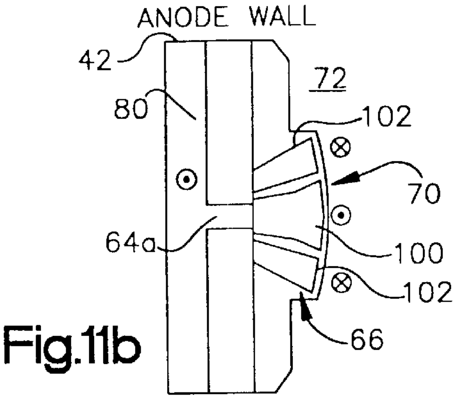
Figure 11C:
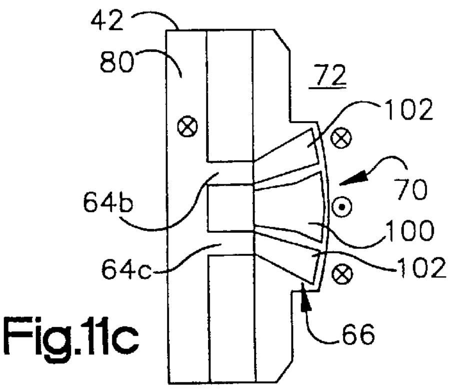

FIGS. 11*a*–11*c* illustrate an embodiment of an optical magnetron 22*e* designed for operation in the $TEM_{20}$ mode in accordance with the present invention. The embodiment is similar to that described above in connection with FIG. 5 in that it includes a toroidal shaped resonant cavity 66 with a curved outer wall 70. The embodiment differs from that of FIG. 5 in that even numbered slots 80 have a single coupling port 64*a* which is aligned with vertex of the curved outer wall 70 as is shown in FIG. 11*b*.Consequently, the even numbered slots 80 tend to excite the central spot 100 of the resonant cavity 66.

On the other hand, the odd numbered slots 80 include two coupling ports 64*b* and 64*c* offset vertically on opposite sides of the vertex of the curved outer wall 70 as is shown in FIG. 11*c*. Consequently, the odd numbered slots 80 will tend to excite outer spots 102 of the resonant cavity 66. The result is a $TEM_{20}$ single mode within the toroidal shaped resonant cavity 66. The central spot 100 has an electric field direction (e.g., out of the page in FIGS. 11*b* and 11*c*) which is opposite the electric field direction (e.g., into the page) of the outer spots 102. The electric fields change direction each half-cycle of the oscillation. The even-numbered slots 80 will thus have their electric fields driven out-of-phase with respect to the odd-numbered slots 80, and the slots 80 are forced to operate in the desired pi-mode.

Figure 11D:
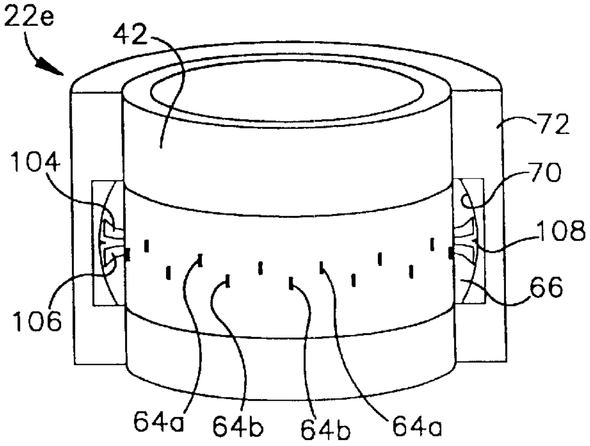
FIGS. 11*d*, 11*e* and 11*f* schematically represent an embodiment of the present invention designed to operate in the $TEM_{10}$ mode.
Figure 11E:
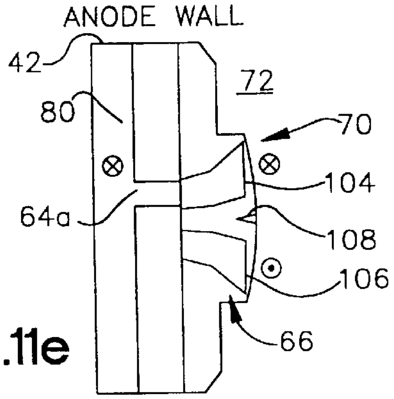
Figure 11F:
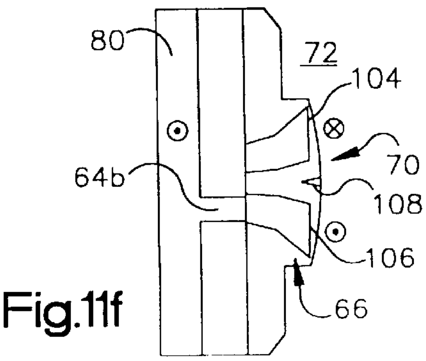

FIGS. 11*d*–11*f* represent an embodiment of an optical magnetron 22*f* which, in this case, is designed for operation in the $TEM_{10}$ mode according to the present invention. Again, the embodiment is similar to that described above in connection with FIG. 5 in that it includes a toroidal shaped resonant cavity 66 with a curved outer wall 70. This embodiment differs from that of FIG. 5 in that even numbered slots 80 have a coupling port 64*a* which is offset above the vertex of the curved outer wall 70 as shown in FIG. 11*e*. As a result, the even numbered slots 80 tend to excite an upper spot 104 of the resonant cavity 66.

The odd numbered slots 80, conversely, include a coupling port 64*b* which is offset below the vertex of the curved outer wall 70 as is shown in FIG. 11*f*. As a result, the odd numbered slots 80 tend to excite a lower spot 106 of the resonant cavity 66. In this case, the result is a $TEM_{10}$ single mode within the toroidal shaped resonant cavity 66. The upper spot 104 has an electric field direction (e.g., into the page in FIGS. 11*e* and 11*f*) which is opposite the electric field direction (e.g., out of the page) of the lower spot 106. A small protrusion 108, or "spoiler" may be provided around the circumference of the resonant cavity 66 at the vertex of the curved outer wall 70 to help suppress the $TEM_{00}$ mode. The respective electric fields of the upper and lower spots change direction each half-cycle of the oscillation. The even numbered slots 80 thus have their electric fields driven out-of-phase with respect to the odd numbered slots 80, and the slots 80 are forced to operate in the desired pi-mode.

FIGS. 11*a*–11*f* present two possible single modes in accordance with the present invention. It will be appreciated, however, that other TEM modes may also be used for pi-mode control without departing from the scope of the invention.

As far as manufacture, the cathode 40 of the magnetron 22 may be formed of any of a variety of electrically conductive metals as will be appreciated. The cathode 40 may be solid or simply plated with an electrically conductive metal such as copper, gold or silver, or may be fabricated from a spiral wound tungsten filament, for example. The anode 42 is also made of an electrically conductive metal and/or of a non-conductive material plated with a conductive layer such as copper, gold or silver. The resonant cavity structure 72 may or may not be electrically conductive, with the exception of the walls of the resonant cavity or cavities 66 and output ports 74 which are either plated or formed with an electrically conductive material such as copper, gold or silver. The anode 42 and resonant cavity structure 72 may be formed separately or as a single integral piece as will be appreciated.

Figure 12A:
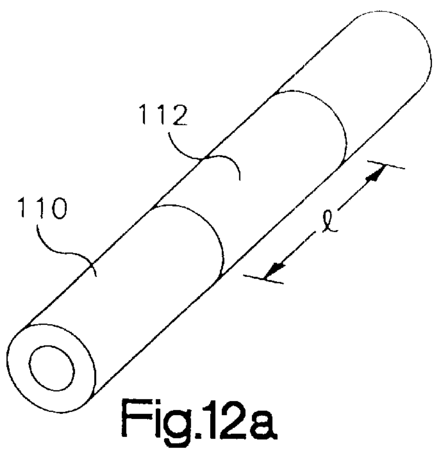
FIGS. 12*a* and 12*b* represent steps used in forming an anode structure in accordance with one embodiment of the present invention.
Figure 12B:
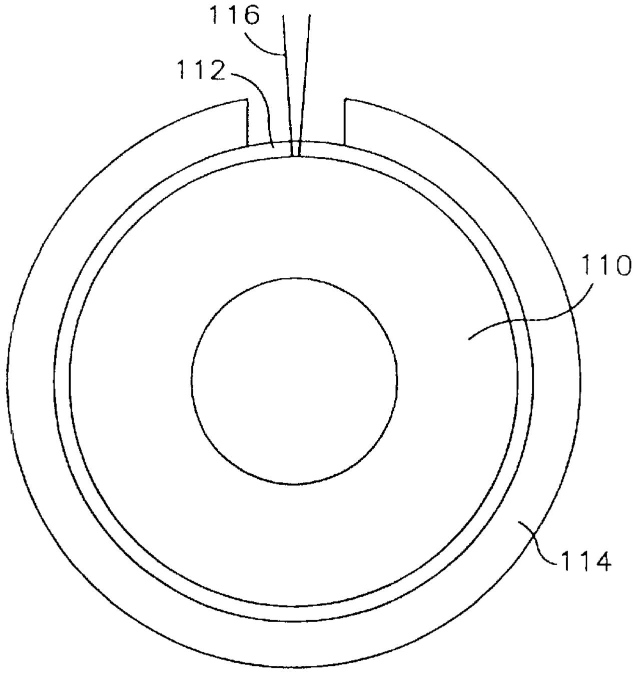

FIGS. 12*a* and 12*b* illustrate an exemplary manner for producing an anode 42 using an electron beam lithography approach. A cylindrical hollow aluminum rod 110 is selected having a radius equal to the desired inner radius $r_a$ of the anode 42. A layer 112 of positive photoresist, for example, is formed about the circumference of the rod 110 as is shown in FIG. 12*a*. The length I of the resist layer 112 along the axis of the rod 110 should be made on the order of the desired length of the anode 42 (e.g., 1 centimeter (cm) to 2 cm). The thickness of the of the resist layer 112 is controlled so as to equal the desired depth of the resonant cavities or slots 80.

The rod 110 is then placed in a jig 114 within an electron beam patterning apparatus used for manufacturing semiconductors, for example, as is represented in FIG. 12*b*. An electron beam 116 is then controlled so as to pattern by exposure individual lines along the length of the of the resist layer 112 parallel with the axis of the rod 110. As will be appreciated, these lines will serve to form the sides of the resonant cavities or slots 80 in the anode 42. The lines are controlled so as to have a width equal to the spacing between adjacent slots 80 (e.g., the quantity $\lambda/2-\lambda/8$ in the case of the embodiments such as FIG. 4*a* and FIG. 4*c*). The lines are spaced apart from each other by the desired width w of the slots 80 (e.g., $\lambda/8$ in the case of embodiments such as FIG. 4*a* and FIG. 4*c*).

The patterned resist layer 112 is then developed and etched such that the exposed portion of the resist layer 112 is removed. This results in the rod 110 having several small fins or vanes, formed from resist, respectively corresponding to the slots 80 which are to be formed in the anode 42. The rod 110 and the corresponding fins or vanes are then copper electroplated to a thickness corresponding to the desired outer diameter of the anode 42 (e.g., 2 mm). As will be appreciated, the copper plating will form around the fins or vanes until the plating ultimately covers the rod 110 substantially uniformly.

The aluminum rod 110 and fins or vanes made of resist are then removed from the copper plating by chemically dissolving the aluminum and resist with any available solvent known to be selective between aluminum/resist and copper. Similar to the technique known as lost wax casting, the remaining copper plating forms an anode 42 with the desired resonant cavities or slots 80.

It will be appreciated that the equivalent structure may be formed via the same techniques except with a negative photoresist and forming an inverse pattern for the slots, etc.

Slots 80 having different depths, such as in the embodiment of FIG. 4*b*, may be formed using the same technique but with multiple layers of resist. A first layer of resist 112 is patterned and etched to form the fins or vanes on the aluminum rod 110 corresponding to both the long slots 80*a* and the short slots 80*b* (FIG. 4*b*). The first layer of resist 112 has a thickness ds corresponding to the depth of the short slots. A second and subsequent layer of resist 112 is formed on the first patterned layer. The second layer 112 is patterned to form the remaining portion of the fins or vanes which will be used to form the long slots 80. In other words, the second layer 112 has a thickness of dl–ds. The various coupling ports 64 may be formed in the same manner, that is with additional layers of resist 112 in order to define the coupling ports 64 at the desired locations. The rod 110 and resist is then copper plated, for example, to form the anode 42 with the rod 110 and resist subsequently being dissolved away. The same technique for forming the coupling ports 64 may be applied to the above-described manufacturing technique for the embodiment of FIG. 4*c*, as will be appreciated.

Figure 13:
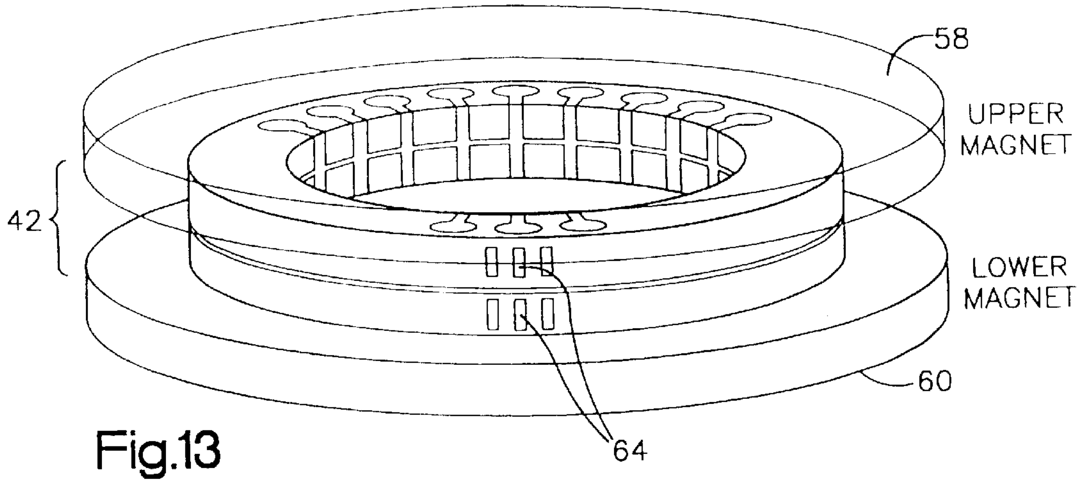
FIG. 13 represents another method for forming an anode structure in accordance with the present invention.

FIG. 13 illustrates the manner in which the anode 42 may be formed as a vertical stack of layers using known micromachining/photolithography techniques. A first layer of metal such as copper is formed on a substrate. A layer of photoresist is then formed on the copper and thereafter the copper is patterned and etched (e.g., via electron beam) so as to define the resonant cavities or slots 80 in a plane normal to the axis of the anode 42. Subsequent layers of copper are then formed and etched atop the original layers in order to create a stack which is subsequently the desired length of the anode 42. As will be appreciated, planarization layers of oxide or some other material may be formed in between copper layers and subsequently removed in order to avoid filling an existing slot 80 when depositing a subsequent layer of copper, for example. Also, such oxide may be used to define coupling ports 64 as desired, such oxide subsequently being removed by a selective oxide/copper etch.

As will be appreciated, known photolithography and micromachining techniques used in the production of semiconductor devices may be used to obtain the desired resolution for the anode 42 and corresponding resonant cavities (e.g., slots 80). The present invention nevertheless is not intended to be limited, in its broadest sense, to the particular methods described herein.

Figure 14A:
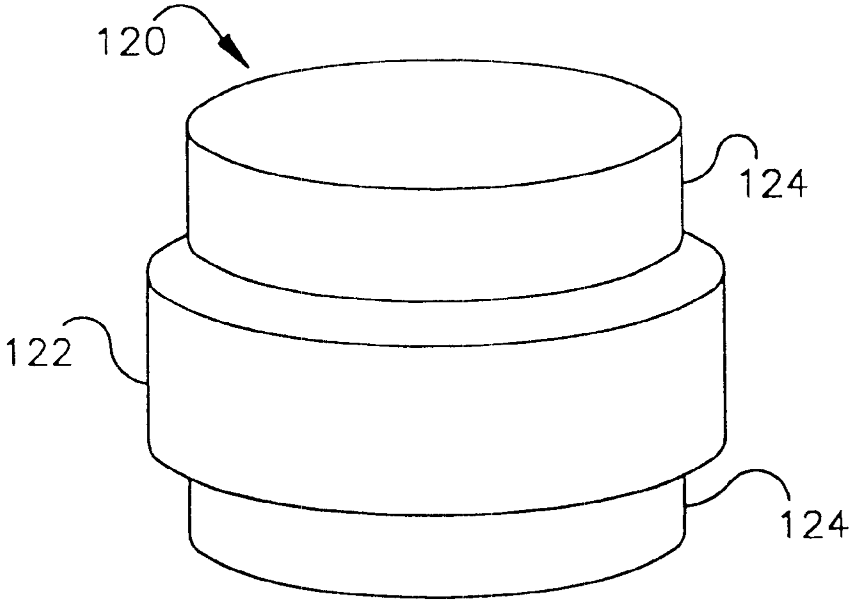
FIGS. 14*a*–14*c* represent steps used in forming a toroidal optical resonator in accordance with the present invention.
Figure 14C:
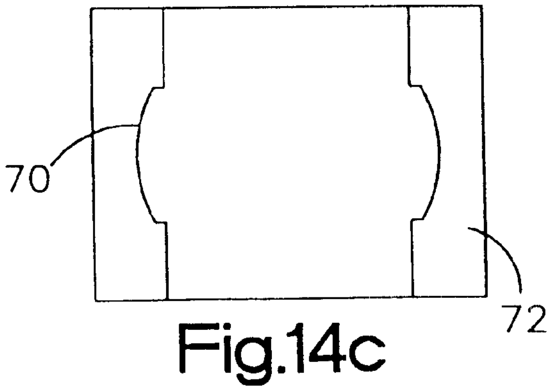
Figure 14B:
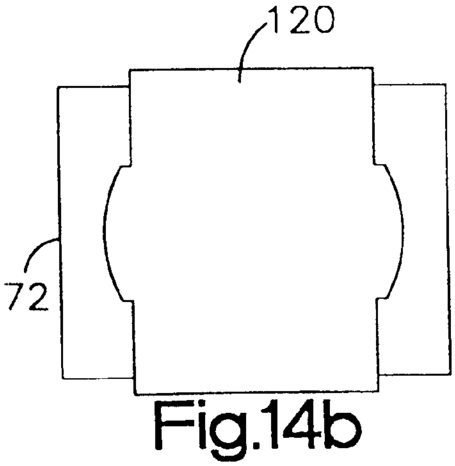

FIGS. 14*a*–14*c* illustrate a technique for forming the resonant cavity structure 72 with a toroidal shape as described herein. For example, an aluminum rod 120 is machined so as to have bump 122 in the middle as shown in FIG. 14*a*. The radius of the rod 120 in upper and lower portions 124 is set equal to approximately the outer radius of the anode 42 around which the structure 72 will fit. The bump 122 is machined so as to have a radius corresponding to the vertex point of the structure 72 to be formed.

Thereafter, the bump 122 is rounded to define the curved toroidal shape of the wall 70 as described above. Next, the thus machined rod 112 is electroplated with copper to form the structure 72 therearound as represented in FIG. 14*b*. The aluminum rod 120 is then chemically dissolved away from the copper structure 72 so as to result in the structure 72 as shown in FIG. 14*c*. Output ports 74 may be formed as needed using micromachining (e.g., via laser milling), for example.

It will therefore be appreciated that the optical magnetron of the present invention is suitable for operating at frequencies heretofore not possible with conventional magnetrons. The optical magnetron of the present invention is capable of producing high efficiency, high power electromagnetic energy at frequencies within the infrared and visible light bands, and which may extend beyond into higher frequency bands such as ultraviolet, x-ray, etc. As a result, the optical magnetron of the present invention may serve as a light source in a variety of applications such as long distance optical communications, commercial and industrial lighting, manufacturing, etc.

Although the invention has been shown and described with respect to certain preferred embodiments, it is obvious that equivalents and modifications will occur to others skilled in the art upon the reading and understanding of the specification. For example, although slots are provided as the simplest form of resonant cavity, other forms of resonant cavities may be used within the anode without departing from the scope of the invention.

Furthermore, although the preferred techniques for providing pi-mode operation have been described in detail, other techniques are also within the scope of the invention. For example, cross coupling may be provided between slots. The slots 80 are spaced by ½λ, and coupling channels are provided between adjacent slots 80. The coupling channels from slot to slot measure 3/2λ. In another embodiment, a plurality of optical resonators are embedded around the circumference of the anode structure with non-adjacent slots constrained to oscillate out of phase by coupling to a single oscillating mode in a corresponding one of the optical resonators. Other means will also be apparent based on the description herein.

Additionally, it will be appreciated that the toroidal resonators described herein which employ curved surfaces and TEM modes to control pi-mode oscillation may be utilized in otherwise conventional magnetrons. More specifically, the feature of the invention relating to a toroidal resonator may be used for controlling pi-mode oscillation in non-optical magnetrons such as those operating at microwave frequencies below 100 Ghz.

The present invention includes all such equivalents and modifications, and is limited only by the scope of the following claims.

What is claimed is:

1. A method of forming an anode for an optical magnetron, comprising the steps of:

forming a photoresist layer around an outer surface of a cylindrical core made of a first material;

patterning and etching the photoresist layer to form a plurality of vanes which extend radially from the outer surface of the cylindrical core to define a plurality of slots;

plating the cylindrical core and vanes with a second material different from the photoresist and the first material; and removing the vanes and cylindrical core from the plating to produce a cylindrical anode having a plurality of slots.

2. The method of claim 1, wherein the vanes and cylindrical core are removed chemically via a solvent.

3. The method of claim 1, wherein the step of patterning is carried out via a photolithographic technique.

4. The method of claim 3, wherein the photolithographic technique is electron beam lithography.

5. A method of forming an anode for an optical magnetron, comprising the steps of:

forming a layer of material from which the anode is to be made;

patterning and etching the layer to form a first layer of a cylindrical anode with a plurality of resonant cavities formed along an inner circumference of the anode;

forming at least one subsequent layer of material and repeating the step of patterning and etching in order to increase the vertical height of the anode.

* * * * *